US012669525B2

(12) United States Patent
Franchini et al.

(10) Patent No.: US 12,669,525 B2
(45) Date of Patent: Jun. 30, 2026

(54) CURRENT SENSING SYSTEMS AND ASSOCIATED METHODS

(71) Applicant: Maxim Integrated Products, Inc, San Jose, CA (US)

(72) Inventors: Luigi Franchini, Rimini (IT); Matteo Carlo Crotti, Bovisio Masciago (IT); Mariangela Di Carlo, Atessa (IT)

(73) Assignee: Maxim Integrated Products, Inc, San Jose, CA (US)

( * ) Notice: Subject to any disclaimer, the term of this patent is extended or adjusted under 35 U.S.C. 154(b) by 266 days.

(21) Appl. No.: 18/464,833

(22) Filed: Sep. 11, 2023

(65) Prior Publication Data

US 2024/0094265 A1     Mar. 21, 2024

Related U.S. Application Data

(60) Provisional application No. 63/376,033, filed on Sep. 16, 2022.

(51) Int. Cl.
*G01R 19/00* (2006.01)
(52) U.S. Cl.
CPC ................................. *G01R 19/0092* (2013.01)
(58) Field of Classification Search
CPC ....... G01R 19/0092; H03K 2217/0027; H02M 1/0009; H02M 3/158
See application file for complete search history.

(56) References Cited

U.S. PATENT DOCUMENTS

| | | | |
|---|---|---|---|
| 10,085,314 B1* | 9/2018 | Milanesi | H05B 47/16 |
| 10,418,954 B1* | 9/2019 | Price | H03F 1/02 |
| 10,797,661 B2 | 10/2020 | Chen et al. | |
| 2014/0233970 A1* | 8/2014 | Hayashi | G03G 15/5037 |
| | | | 399/40 |
| 2019/0319616 A1* | 10/2019 | Qin | H03K 17/223 |
| 2022/0397591 A1* | 12/2022 | Zhao | G01R 19/22 |

* cited by examiner

*Primary Examiner* — Dominic E Hawkins
(74) *Attorney, Agent, or Firm* — DLA Piper LLP (US)

(57) ABSTRACT

A method for sensing current includes (a) generating a first current signal representing magnitude of current flowing through a sensing element while a first switching device is in its on-state and a second switching device is in its off-state, each of the first switching device and the second switching device being electrically coupled to the sensing element, (b) generating a second current signal representing magnitude of current flowing through the sensing element while the first switching device is in its off-state and the second switching device is in its on-state, and (c) generating a composite current signal from the first current signal and the second current signal, the composite current signal representing magnitude of current flowing through the sensing element.

17 Claims, 13 Drawing Sheets

CURRENT SENSING SYSTEMS AND ASSOCIATED METHODS

RELATED APPLICATIONS

This application claims the benefit of priority to U.S. Provisional Patent Application No. 63/376,033, filed on Sep. 16, 2022, which is incorporated herein by reference.

BACKGROUND

There are many applications for current sensing, which is the sensing of magnitude and/or polarity of current flowing through an electrical conductor. For example, current sensing is typically required in high performance motor drive applications, as well as in high performance solenoid drive applications. As another example, current sensing is frequently used in voltage regulator applications, such as to enable control of voltage magnitude as a function of current magnitude.

DETAILED DESCRIPTION OF THE EMBODIMENTS

Disclosed herein are current sensing systems and associated methods which significantly advance the state of the art. Particular embodiments of the new current sensing systems include a plurality of signal generators for generating respective current signals representing magnitude of current flowing through one or more sensing elements. Each signal generator is active, for example, when a respective switching device is operating in its on-state. The current signals from the plurality of signal generators are combined to generate a composite current signal representing current flowing through the one or more sensing elements.

The new current sensing systems and associated methods may achieve significant advantages. For example, certain embodiments are capable of continuously sensing current, such as current flowing between a driver stage and a load. Continuous current sensing, in turn, may facilitate analog-to-digital (A/D) conversion of current sensing information, multisampling of current sensing information, averaging of current sensing information and increasing current control loop bandwidth in closed loop systems. Additionally, continuous current sensing may enable use of high resolution Sigma-Delta A/D conversion techniques when converting current sensing information from analog to digital form. Furthermore, continuous current sensing helps optimizing printed circuit board (PCB) layout resulting in lower risk of electromagnetic interference (EMI) and better heat distribution. Finally, continuous current sense is often required to monitor the current continuously for diagnostic and safety considerations.

Additionally, some embodiments of the new current sensing systems are configured such that each signal generator is electrically referenced to the same node as an associated switching device. Such electrical referencing may advantageously eliminate the need for the new current sensing systems to withstand voltage magnitude and high voltage slew rate, which promotes low cost, small size, and high performance of the current sensing systems.

Figure 1:
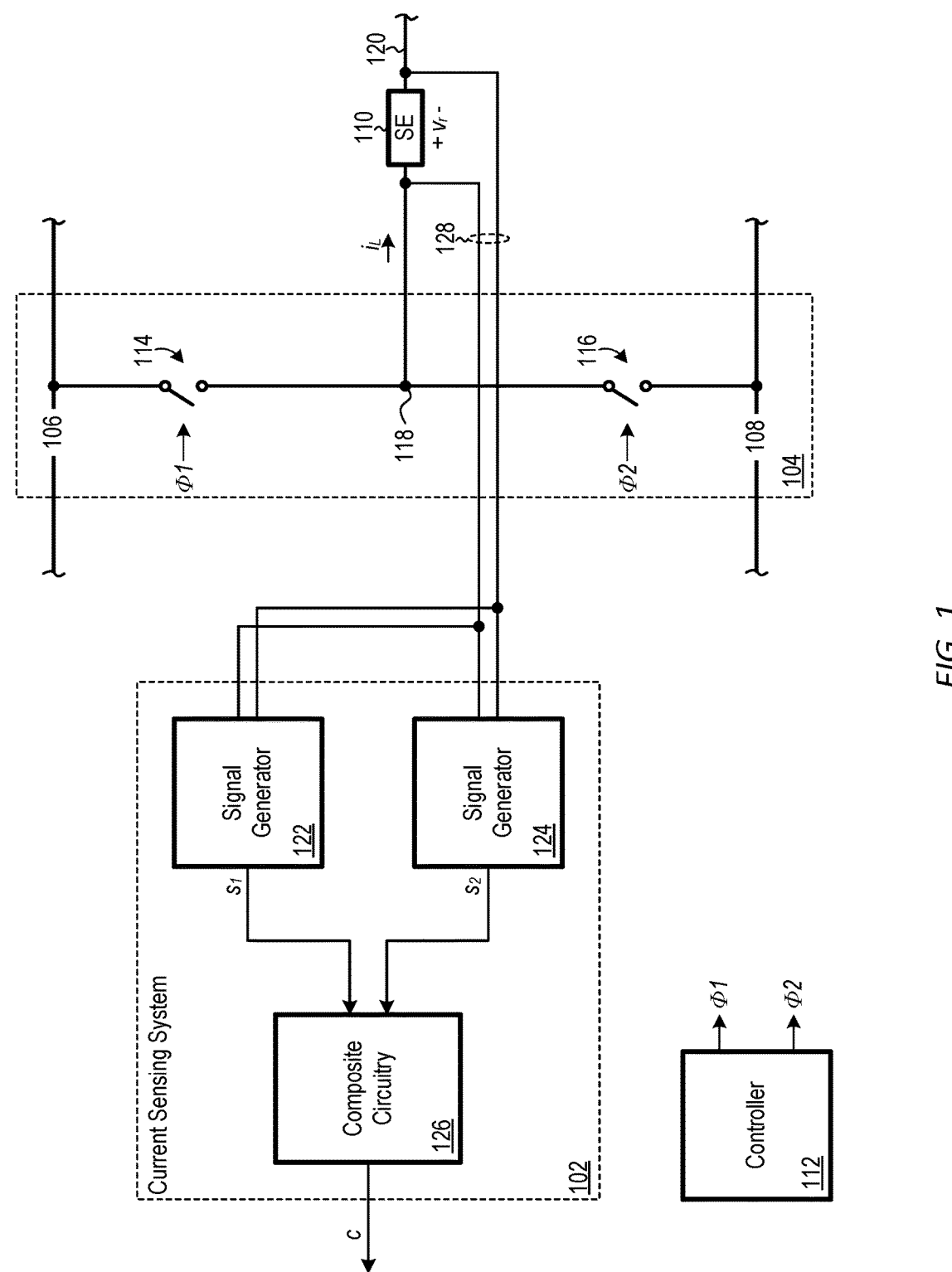
FIG. 1 is a schematic diagram of an electrical apparatus including a current sensing system, according to an embodiment.
Figures 2A, 2B, 2C, 2D, 2E, 2F:
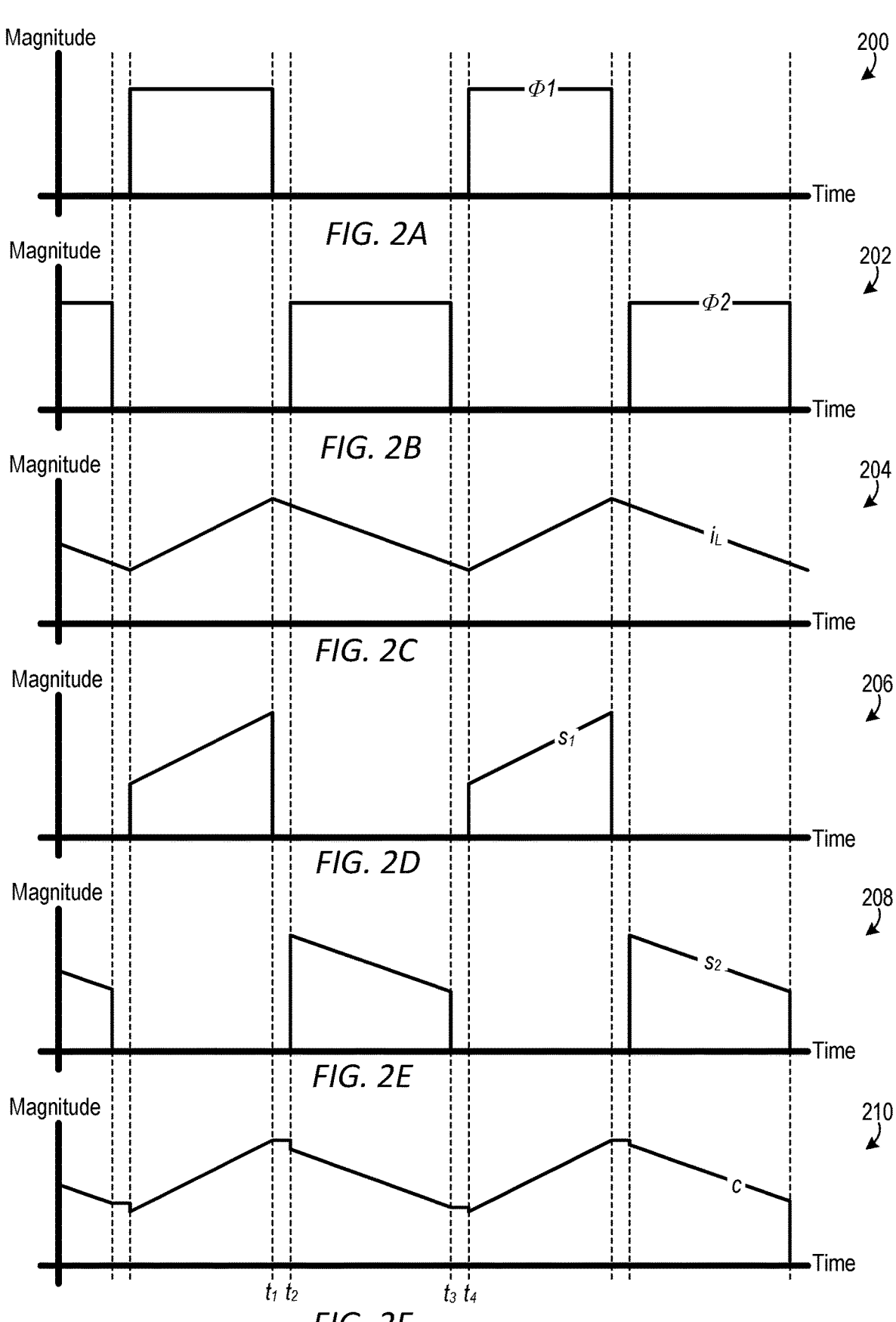
FIGS. 2A, 2B, 2C, 2D, 2E, and 2F are graphs collectively illustrating one example of operation of the current sensing system of FIG. 1, according to an embodiment.
Figures 3A, 3B, 3C, 3D, 3E, 3F:
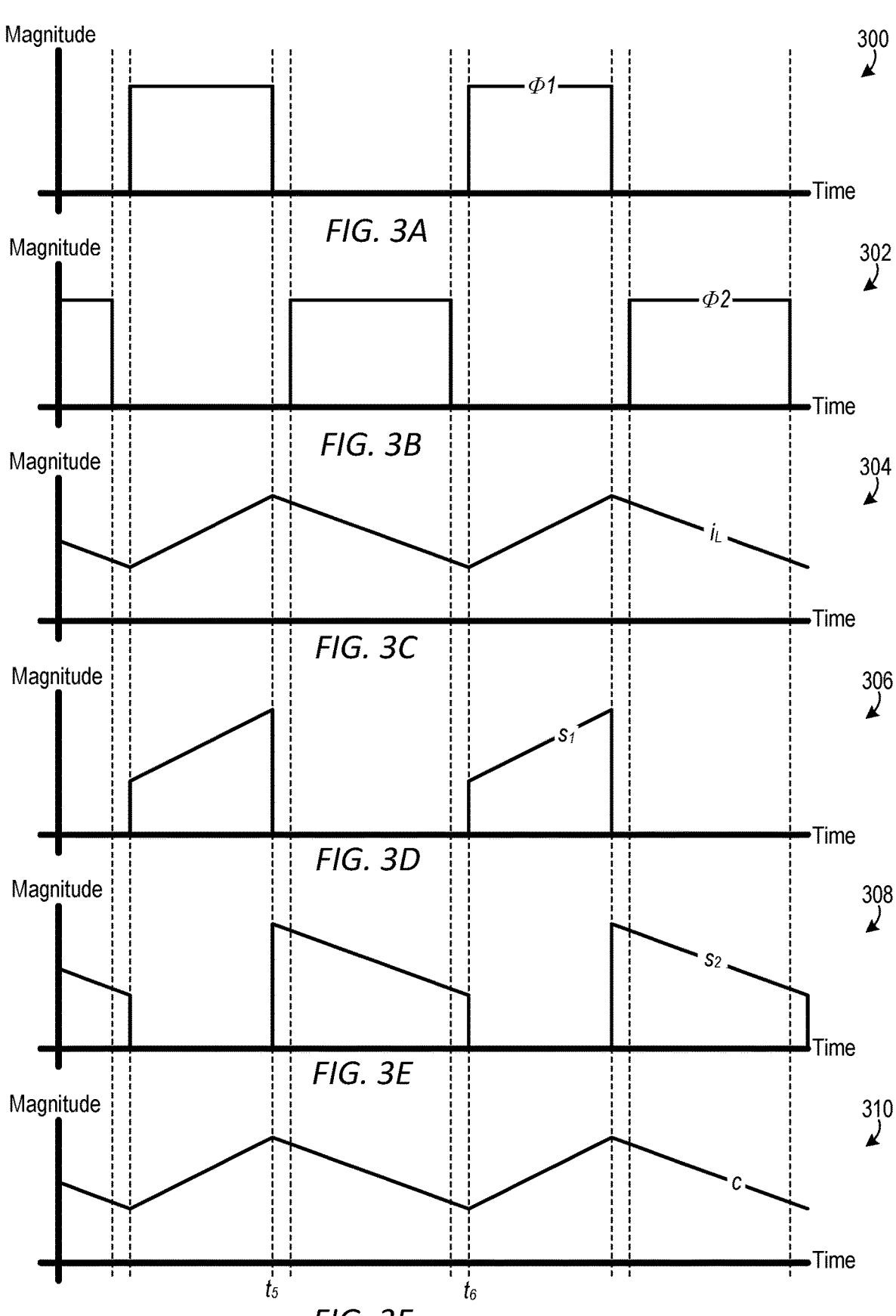
FIGS. 3A, 3B, 3C, 3D, 3E, and 3F are graphs collectively illustrating another example of operation of the current sensing system of FIG. 1, according to an embodiment.

FIG. 1 is a schematic diagram of an electrical apparatus 100 including a current sensing system 102, where current sensing system 102 is one embodiment of the new current sensing systems disclosed herein. Electrical apparatus 100 further includes a driver stage 104, a first power rail 106, a second power rail 108, a sensing element (SE) 110, and a controller 112. Electrical apparatus 100 may include additional elements (not shown) without departing from the scope hereof. In some embodiments, first power rail 106 is at a higher electrical potential than second power rail 108, such that first power rail 106 is a positive power rail and second power rail 108 is a negative power rail. While not required, in certain embodiments, either first power rail 106 or second power rail 108 is referenced to ground or another reference node.

Driver stage 104 includes a first switching device 114 and a second switching device 116 controlled by a first control signal $\phi 1$ and a second control signal $\phi 2$, respectively. Each of first switching device 114 and second switching device 116 includes, for example, one or more transistors, such as one more field effect transistors (FETs), bipolar junction transistors (BJTs), insulated gate bipolar junction transistors (IGBTs) and/or WideBandgap power devices such as GAN or SiC. First switching device 114 is electrically coupled between first power rail 106 and a switching node 118, and second switching device 116 is electrically coupled between switching node 118 and second power rail 108. Sensing element 110 is electrically coupled between switching node 118 and an additional node 120. Accordingly, each of first switching device 114 and second switching device 116 is electrically coupled to sensing element 110 at switching node 118. In some embodiments, a load (not shown) is electrically coupled to additional node 120. However, other types of elements could be electrically coupled to additional node 120 without departing from the scope hereof.

In certain embodiments, sensing element 110 includes a resistive device, such as a current sense resistor or other type of resistor. Sensing element 110 need not be a discrete device. For example, sensing element 110 could be formed of one or more PCB conductors (e.g., PCB traces). Additionally, sensing element 110 could include a plurality of sub-elements, such as two or more resistive devices electrically coupled in series and/or in parallel.

Controller 112 is configured to generate first control signal $\Phi1$ and second control signal $\Phi2$ to control first switching device 114 and second switching device 116, respectively. Connections between controller 112 and each of first switching device 114 and second switching device 116 are not shown. Controller 112 is configured to generate first control signal $\Phi1$ and second control signal $\Phi2$ to cause driver stage 104 to repeatedly switch between at least a first state and a second state, such as to realize voltage regulation and/or current regulation in electrical apparatus 100. The first state is characterized by first switching device 114 being in its on-state and second switching device 116 being in its off-state, such that driver stage 104 electrically couples sensing element 110 to first power rail 106. Conversely, the second state is characterized by first switching device 114 being in its off-state and second switching device 116 being in its on-state, such that driver stage 104 electrically couples sensing element 110 to second power rail 108. In this document, a switching device is in its on-state when the switching device is in a conductive state, and a switching device is in its off state when the switching device is in a non-conductive state.

Controller 112 may be further configured generate first control signal $\Phi1$ and second control signal $\Phi2$ to cause driver stage 104 to operate in one or more additional states, such as during transitions between the first state and the second state. For example, driver stage 104 may operate in a third state for a short time while transitioning from the first state to the second state, or vice versa, where the third state is characterized by each of first switching device 114 and second switching device 116 operating in its off-state. Operating in the third state while transitioning between the first state and the second state may reduce likelihood of shoot-through, i.e., simultaneous conduction of each of first switching device 114 and second switching device 116. Certain embodiments of controller 112 are configured to generate first control signal $\Phi1$ and second control signal $\Phi2$ such that driver stage 104 repeatedly switches between the first state and the second state using a pulse width modulation (PWM) control technique or a pulse frequency modulation (PFM) control technique, such as to regulate voltage and/or current in electrical apparatus 100.

Current sensing system 102 includes a first signal generator 122, a second signal generator 124, and composite circuitry 126. Each of first signal generator 122 and second signal generator 124 is configured to sense a voltage $v_r$ across sensing element 110 via sensing lines 128, where sensing lines 128 include, for example, PCB traces, wires, or other electrical conductors. First signal generator 122 is associated with first switching device 114, and second signal generator 124 is associated with second switching device

116. Accordingly, first signal generator 122 is configured to generate a first current signal $s_1$ representing magnitude of current $i_L$ flowing through sensing element 110 while first switching device 114 is in its on-state and second switching device 116 is in its off-state. Additionally, second signal generator 124 is configured to generate a second current signal $s_2$ representing magnitude of current $i_L$ flowing through sensing element 110 while second switching device 116 is in its on-state and first switching device 114 is in its off-state. Each of first current signal $s_1$ and second current signal $s_2$ is, for example, an electrical signal (e.g., a current signal or a voltage signal), an optical signal, or a radio frequency (RF) signal. First current signal $s_1$ and second current signal $s_2$ may be in either analog or digital form, depending on the implementation of first signal generator 122 and second signal generator 124.

Composite circuitry 126 is configured to generate a composite current signal c from first current signal $s_1$ and second current signal $s_2$, where composite current signal c represents magnitude of current flowing $i_L$ through sensing element 110. In particular embodiments, composite current signal c represents one of first current signal $s_1$ or second current signal $s_2$ at any given time. Some embodiments of composite circuitry 126 are configured to generate composite current signal c by superimposing first current signal $s_1$ and second current signal $s_2$. For example, certain embodiments of composite circuitry 126 are configured to (a) generate composite current signal c from first current signal $s_1$, and not second current signal $s_2$, while first switching device 114 is in its on-state and second switching device 116 is in its off-state, and (b) generate composite current signal c from second current signal $s_2$, and not first current signal $s_1$, while second switching device 116 is in its on-state and first switching device 114 is in its off-state.

Certain embodiments of composite circuitry 126 are configured to generate composite current signal c such that composite current signal c is continuous. For example, particular embodiments of composite circuitry 126 are configured to generate composite current signal c such that (a) composite current signal c represents a last-sampled magnitude of current flowing through sensing element 110 while driver stage 104 operates in the first state, during a transition of driver stage 104 from the first state to the second state, and (b) composite current signal c represents a last-sampled magnitude of current flowing through sensing element 110 while driver stage 104 operates in the second state, during a transition of driver stage 104 from the second state to the first state. Such generation of a continuous composite current signal c may be particularly advantageous to mask spurious current signals due to the charge/discharge of switching node 118 that are not representative of the actual current flowing to a load connected to additional node 120. It is also advantageous in embodiments of where driver stage 104 operates in a third state during transitions between the first state and the second state, by preventing discontinuity in composite current signal c associated with operation in the third state.

FIGS. 2A-2F are graphs 200, 202, 204, 206, 208, and 210, respectively, of magnitude versus time which collectively illustrate one example of operation of current sensing system 102 in electrical apparatus 100. It is understood, though, that current sensing system 102 is not limiting to operating according to this example. Each of graphs 200, 202, 204, 206, 208, and 210 has a common time base, as represented by the common vertical dashed lines shared by all of the graphs. Graph 200 illustrates magnitude of control signal $\Phi1$ as a function of time, graph 202 illustrates magnitude of control signal $\phi 2$ as a function of time, and graph 204 illustrates magnitude of current it, as a function of time. In this example, each of first switching device 114 and second switching device 116 operates in its on state when its respective first control signal $\phi 1$ and second control signal $\phi 2$ is in a logic high state. However, electrical apparatus 100 could be configured such that first switching device 114 and second switching device 116 respond to control signals in a different manner.

Graph 206 illustrates magnitude of first current signal $s_1$ as a function of time, graph 208 illustrates magnitude of second control signal $s_2$ as a function of time, and graph 210 illustrates magnitude of composite current signal c as a function from time. In this example, each of first signal generator 122 and second signal generator 124 generates its respective current signal $s_1$ and $s_2$ solely when its associated switching device is in its on-state. Composite circuitry 126 is configured to generate composite current signal c in this example by superimposing first current signal $s_1$ and second current signal $s_2$. However, composite circuitry 126 is further configured in this example such that composite current signal c is continuous by (a) holding composite current signal c at the last value of first current signal $s_1$ during transitions of driver stage 104 from the first state to the second state, e.g., during the time period between $t_1$ and $t_2$, and (b) holding composite signal current signal c at the last value of second current signal $s_2$ during transitions of driver stage 104 from the second state to the first state, e.g., during the time period between $t_3$ and $t_4$.

FIGS. 3A-3F are graphs 300, 302, 304, 306, 308, and 310, respectively, of magnitude versus time which collectively illustrate another example of operation of current sensing system 102 in electrical apparatus 100. Each of graphs 300, 302, 304, 306, 308, and 310 has a common time base, as represented by the common vertical dashed lines shared by all of the graphs. Graph 300 illustrates magnitude of first control signal $\Phi 1$ as a function of time, graph 302 illustrates magnitude of second control signal $\Phi 2$ as a function of time, and graph 304 illustrates magnitude of current $i_L$ as a function of time. As in the preceding example of FIGS. 2A-2F, each of first switching device 114 and second switching device 116 operates in its on state when its respective control signal $\Phi_1$ and $\Phi_2$ is in a logic high state, in the example of FIGS. 3A-3F. However, electrical apparatus 100 could be configured such that first switching device 114 and second switching device 116 respond to control signals in a different manner.

Graph 306 illustrates magnitude of first current signal $s_1$ as a function of time, graph 308 illustrates magnitude of second control signal $s_2$ as a function of time, and graph 310 illustrates magnitude of composite current signal c as a function from time. In this example, first signal generator 122 generates current signal $s_1$ solely when associated first switching device 114 is in its on-state. However, in contrast to the preceding example of FIGS. 2A-2F, second signal generator 124 is configured to generate second current signal $s_2$ not only when associated second switching device 116 is in its on-state, but also when first switching device 114 is in its off state. For example, second signal generator 124 generates second current signal $s_2$ during the entire period between $t_5$ and $t_6$. Composite circuitry 126 is configured to generate composite current signal c as the superposition of first current signal $s_1$ and second current signal $s_2$, and composite current c is accordingly continuous, in this example.

Figure 4:
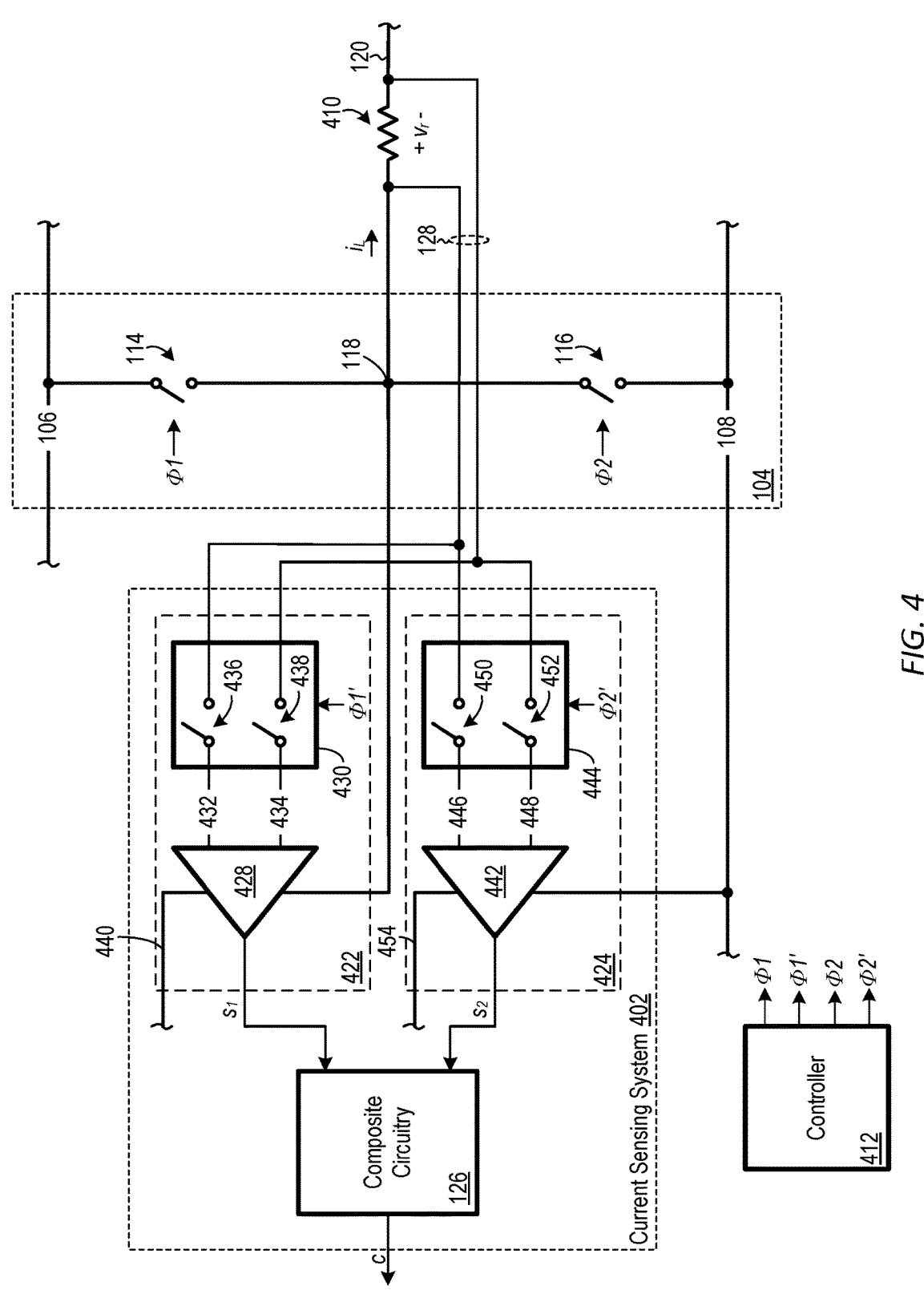
FIG. 4 is a schematic diagram of an embodiment of the FIG. 1 electrical apparatus where each signal generator includes a respective amplifier and respective switching circuitry.

FIG. 4 is a schematic diagram of an electrical apparatus 400, which is an embodiment of electrical apparatus 100 of FIG. 1 where (a) current sensing system 102 is embodied by a current sensing system 402, (b) sensing element 110 is embodied by a resistive device 410, and (c) controller 112 is embodied by a controller 412. Controller 412 is configured to generate control signals $\Phi 1'$ and $\Phi 2'$ in addition to first control signal $\Phi 1$ and second control signal $\Phi 2$. Control signal $\Phi 1'$ is similar to, e.g., synchronized with, first control signal $\Phi 1$, and control signal $\Phi 2'$ is similar to, e.g., synchronized with, second control signal $\Phi 2$. For example, in some embodiments, control signal $\Phi 1'$ is essentially equivalent to first control signal $\Phi 1$, while control signal $\Phi 2'$ is asserted not only when second control signal $\Phi 2$ is asserted, but also when first control signal $\Phi 1$ is de-asserted.

Current sensing system 402 includes a first signal generator 422, a second signal generator 424, and an instance of composite circuitry 126. First signal generator 422 and second signal generator 424 are embodiments of first signal generator 122 and second signal generator 124, respectively. First signal generator 422 includes a first amplifier 428 and first switching circuitry 430. First switching circuitry 430 is configured to selectively electrically couple inputs 432 and 434 of first amplifier 428 across resistive device 410. In particular, first switching circuitry 430 includes a switching device 436 and a switching device 438. Switching device 436 is electrically coupled between switching node 118 and amplifier input 432, and switching device 438 is electrically coupled between additional node 120 and amplifier input 434. First switching circuitry 430 is controlled by a control signal $\Phi 1'$, and each of switching device 436 and switching device 438 is configured to (a) operate in its on-state when control signal $\Phi 1'$ is asserted and (b) operate in its off-state when control signal $\Phi 1'$ is de-asserted. Inputs 432 and 434 of amplifier 428 are electrically coupled across resistive device 410, for example, solely when first switching device 114 operates in its on-state. As discussed above, in particular embodiments, control signal $\Phi 1'$ is synchronized with first control signal $\Phi 1$, and first switching circuitry 430 may accordingly be synchronized with first control signal $\Phi 1$.

First amplifier 428 is configured to amplify voltage $v_r$ across resistive device 410 to generate current signal $s_1$, at least while first switching device 114 is in its on-state and second switching device 116 is in its off-state. First amplifier 428 is powered from a power supply rail 440, and first amplifier 428 is referenced to switching node 118. As such, each of first switching device 114 and first amplifier 428 are referenced to the same node, i.e., to switching node 118.

Second signal generator 424 includes a second amplifier 442 and second switching circuitry 444. Second switching circuitry 444 is configured to selectively electrically couple inputs 446 and 448 of second amplifier 442 across resistive device 410. In particular, second switching circuitry 444 includes a switching device 450 and a switching device 452. Switching device 450 is electrically coupled between switching node 118 and amplifier input 446, and switching device 452 is electrically coupled between additional node 120 and amplifier input 448. Second switching circuitry 444 is controlled by control signal $\Phi 2'$, and each of switching device 450 and switching device 452 is configured to (a) operate in its on-state when control signal $\Phi 2'$ is asserted and (b) operate in its off-state when second control signal $\Phi 2'$ is de-asserted. Inputs 446 and 448 of second amplifier 442 are electrically coupled across resistive device 410, for example, solely when second switching device 116 operates in its on-state or solely when first switching device 114 operates in its off-state. As discussed above, in particular embodiments, control signal $\Phi 2'$ is synchronized with second control signal $\Phi 2$, and second switching circuitry 444 may accordingly be synchronized with second control signal $\Phi 2$.

Second amplifier 442 is configured to amplify voltage $v_r$ across resistive device 410 to generate current signal $s_2$, at least while second switching device 116 is in its on-state and first switching device 114 is in its off-state. Second amplifier 442 is powered from a power supply rail 454, and second amplifier 442 is referenced to second power rail 108. As such, each of second switching device 116 and second amplifier 442 are referenced to the same node, i.e., to the node of second power rail 108.

Figure 5:
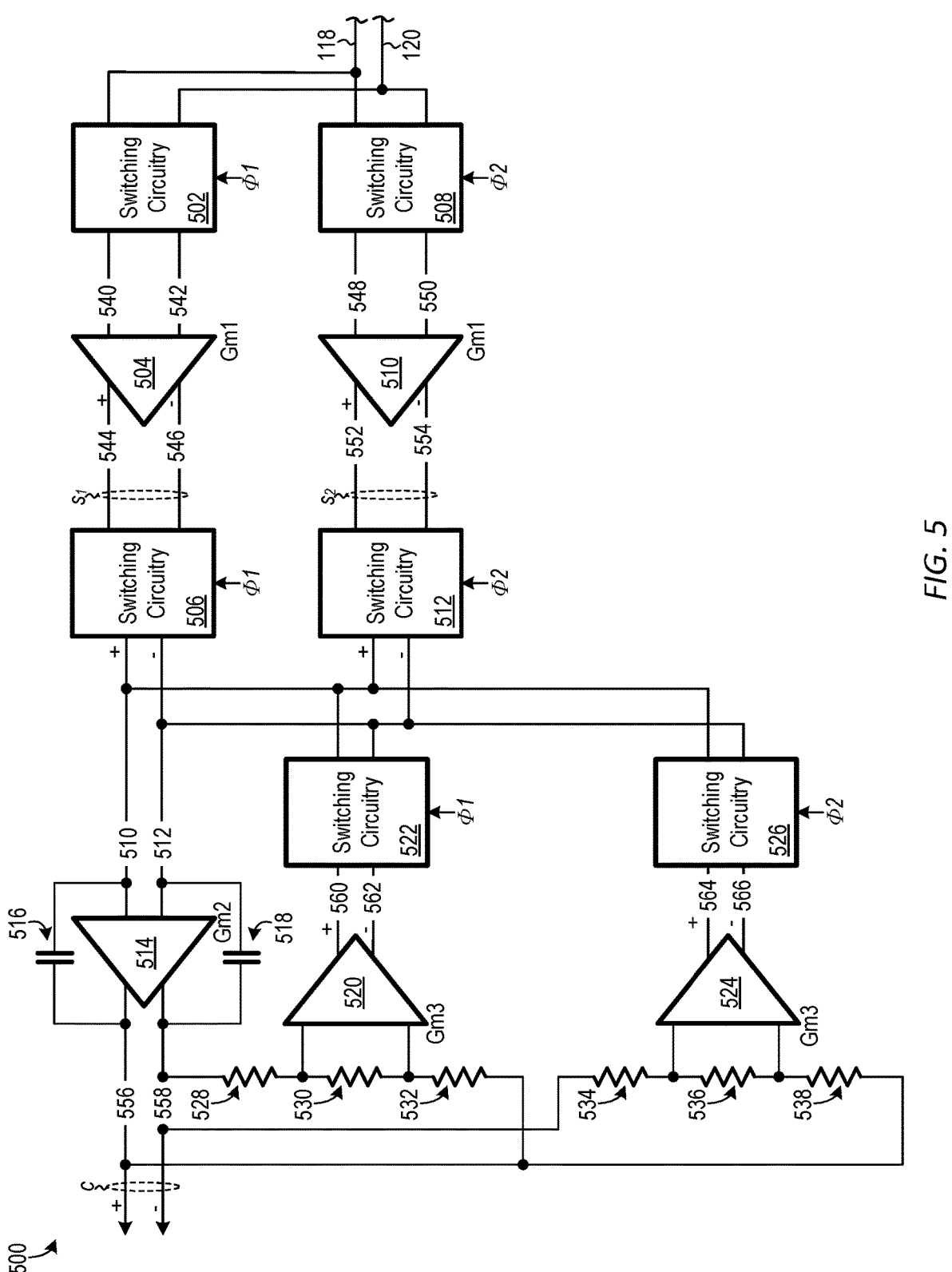
FIG. 5 is a schematic diagram of another embodiment of the current sensing system of the FIG. 1.

FIG. 5 is a schematic diagram of a current sensing system 500, which is another embodiment of current sensing system 102 of FIG. 1. First signal generator 122 of FIG. 1 is collectively implemented by switching circuitry 502, a transconductance amplifier 504, and switching circuitry 506, in current sensing system 500. Second signal generator 124 of FIG. 1 is collectively implemented by switching circuitry 508, a transconductance amplifier 510, and switching circuitry 512, in current sensing system 500. Composite circuitry 126 of FIG. 1 is collectively implemented by summing nodes 510 and 512, a transconductance amplifier 514, a feedback capacitor 516, a feedback capacitor 518, a transconductance amplifier 520, switching circuitry 522, a transconductance amplifier 524, switching circuitry 526, and resistors 528-538.

Switching circuitry 502 is configured to selectively electrically couple inputs 540 and 542 of transconductance amplifier 504 across sensing element 110 (not shown in FIG. 5). In particular, switching circuitry 502 is configured to (a) electrically coupled inputs 540 and 542 to switching node 118 and additional node 120, respectively, when first control signal $\Phi 1$ is asserted, and (b) electrically isolate inputs 540 and 542 from switching node 118 and additional node 120, respectively, when first control signal $\Phi 1$ is de-asserted. Transconductance amplifier 504 is configured to generate current sense signal $s_1$ on outputs 544 and 546 in response to voltage across sensing element 110, and transconductance amplifier 504 has a nominal transconductance of Gm1. Switching circuitry 506 is configured to selectively couple outputs 544 and 546 to summing nodes 510 and 512, respectively. Specifically, switching circuitry 506 is configured to (a) electrically couple outputs 544 and 546 to summing nodes 510 and 512, respectively, when first control signal $\Phi 1$ is asserted, and (b) electrically isolate outputs 544 and 546 from summing nodes 510 and 512, respectively, when first control signal $\Phi 1$ is de-asserted. In some embodiments, switching circuitry 502 has a higher voltage rating than switching circuitry 506.

Switching circuitry 508 is configured to selectively electrically couple inputs 548 and 550 of transconductance amplifier 510 across sensing element 110 (not shown in FIG. 5). In particular, switching circuitry 508 is configured to (a) electrically coupled inputs 548 and 550 to switching node 118 and additional node 120, respectively, when second control signal $\Phi 2$ is asserted, and (b) electrically isolate inputs 548 and 550 from switching node 118 and additional node 120, respectively, when second control signal $\Phi 2$ is de-asserted. Transconductance amplifier 510 is configured to generate current sense signal $s_2$ on outputs 552 and 554 in response to voltage across sensing element 110, and transconductance amplifier 510 has a nominal transconductance of Gm1 like transconductance amplifier 504. Switching circuitry 512 is configured to selectively couple outputs 552 and 554 to summing nodes 510 and 512, respectively. Specifically, switching circuitry 510 is configured to (a) electrically couple outputs 552 and 554 to summing nodes

510 and 512, respectively, when second control signal $\Phi 2$ is asserted, and (b) electrically isolate outputs 552 and 554 from summing nodes 510 and 512, respectively, when second control signal $\Phi 2$ is de-asserted. In some embodiments, switching circuitry 508 has a higher voltage rating than switching circuitry 512.

Summing nodes 510 and 512 superimpose current sense signal $s_1$ and current sense signal $s_2$ by summing the two current sense signals, as electrically coupled to summing nodes 510 and 512 by switching circuitry 506 and 512, respectively. Transconductance amplifier 514 amplifies the sum of current sense signal $s_1$ and current sense signal $s_2$ to generate composite current signal c on output nodes 556 and 558.

Transconductance amplifier 520, switching circuitry 522, transconductance amplifier 524, switching circuitry 526, and resistors 528-538 are collectively configured to trim transconductance amplifier 514 and thereby adjust its offset. Transconductance amplifier 514 has a nominal transconductance of Gm2. Feedback capacitor 516 is electrically coupled between summing node 510 and output node 556, and feedback capacitor 518 is electrically coupled between summing node 512 and output node 558. Transconductance amplifiers 520 and 524 have a common transconductance value of Gm3. Switching circuitry 522 is configured to (a) electrically couple outputs 560 and 562 of transconductance amplifier 520 to summing nodes 510 and 512, respectively, when first control signal $\Phi 1$ is asserted, and (b) electrically isolate outputs 560 and 562 of transconductance amplifier 520 from summing nodes 510 and 512, respectively, when first control signal $\Phi 1$ is de-asserted. Switching circuitry 526 is configured to (a) electrically couple outputs 564 and 566 of transconductance amplifier 524 to summing nodes 510 and 512, respectively, when second control signal $\Phi 2$ is asserted, and (b) electrically isolate outputs 564 and 566 of transconductance amplifier 524 from summing nodes 510 and 512, respectively, when second control signal $\Phi 2$ is de-asserted. In some embodiments, switching circuitry 522 has a lower voltage rating than switching circuitry 502, and switching circuitry 526 has a lower voltage rating than switching circuitry 508.

Figure 6:
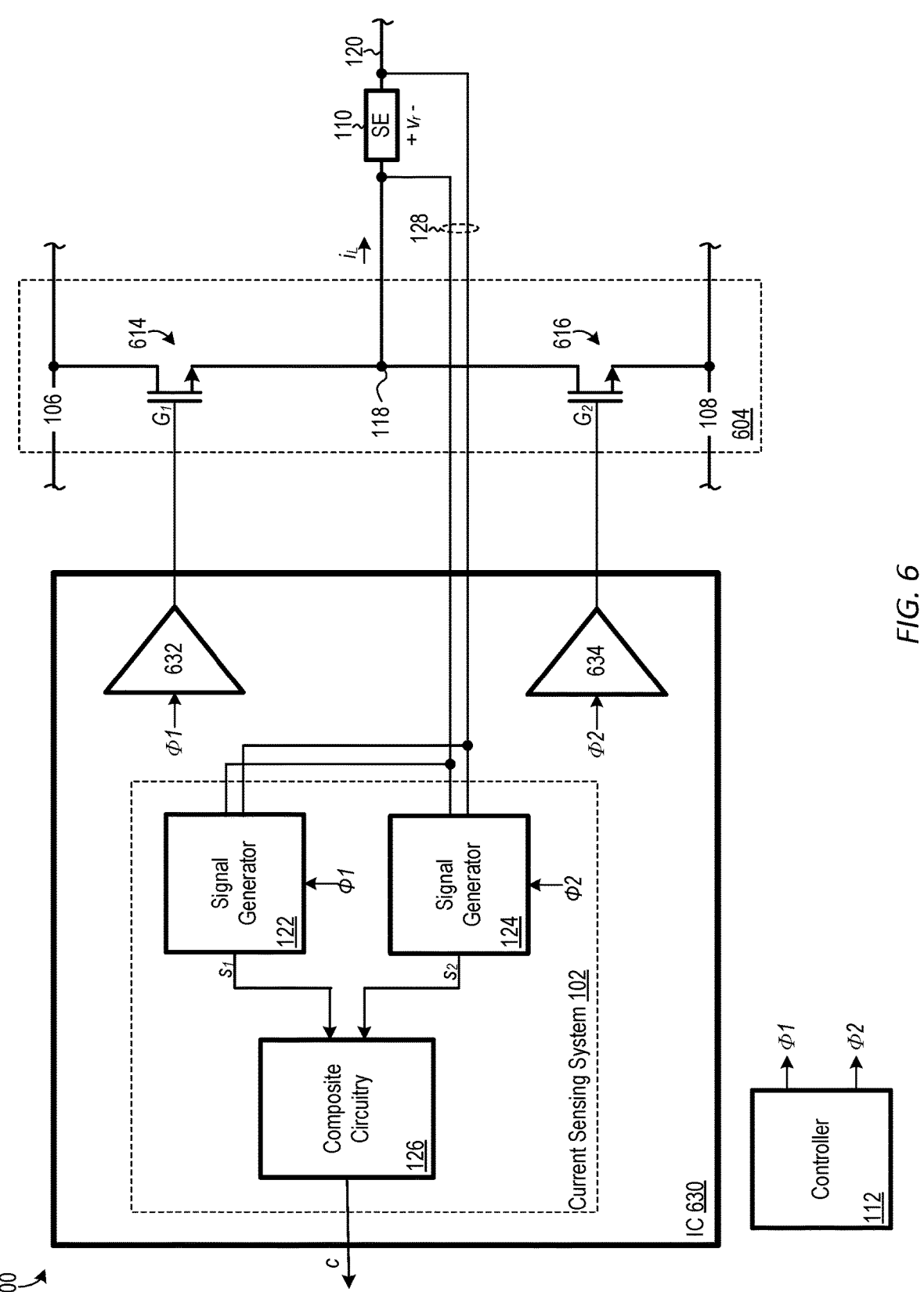
FIG. 6 is a schematic diagram of an embodiment of the FIG. 1 electrical apparatus where the current sensing system is integrated with gate drivers in a common integrated circuit.

Referring again to FIG. 1, while current sensing system 102 is illustrated as being separate from other elements of electrical apparatus 100, current sensing system 102 could be partially or fully combined with one or more other elements of electrical apparatus 100. For example, FIG. 6 is a schematic diagram of an electrical apparatus 600, which is an embodiment of electrical apparatus 100 of FIG. 1 where current sensing system 102 is integrated with other circuitry in a common integrated circuit (IC) 630. Driver stage 104 of FIG. 1 is embodied by a driver stage 604 in FIG. 6, where first switching device 114 and second switching device 116 are implemented by a first FET 614 and a second FET 616, respectively. IC 630 includes a first gate driver 632 and a second gate driver 634 in addition to current sensing system 102. First gate driver 632 is configured to drive a gate $G_1$ of first FET 614 in response to control signal $\Phi 1$, and second gate driver 634 is configured to drive a gate $G_2$ of second FET 616 in response to control signal $\Phi 2$. While not required, FIG. 6 depicts first signal generator 122 and second signal generator 124 respectively receiving first control signal $\Phi 1$ and second control signal $\Phi 2$, such as for synchronizing the signal generators with first control signal $\Phi 1$ and second control signal $\Phi 2$ in a manner similar to that discussed above with respect to FIG. 4. Control of first signal generator 122 and first gate driver 632 by common first control signal $\Phi 1$, as well as control of second signal generator 124 and second gate driver 634 by common second control signal Φ2, may advantageously promote simplicity of IC 630.

Figure 7:
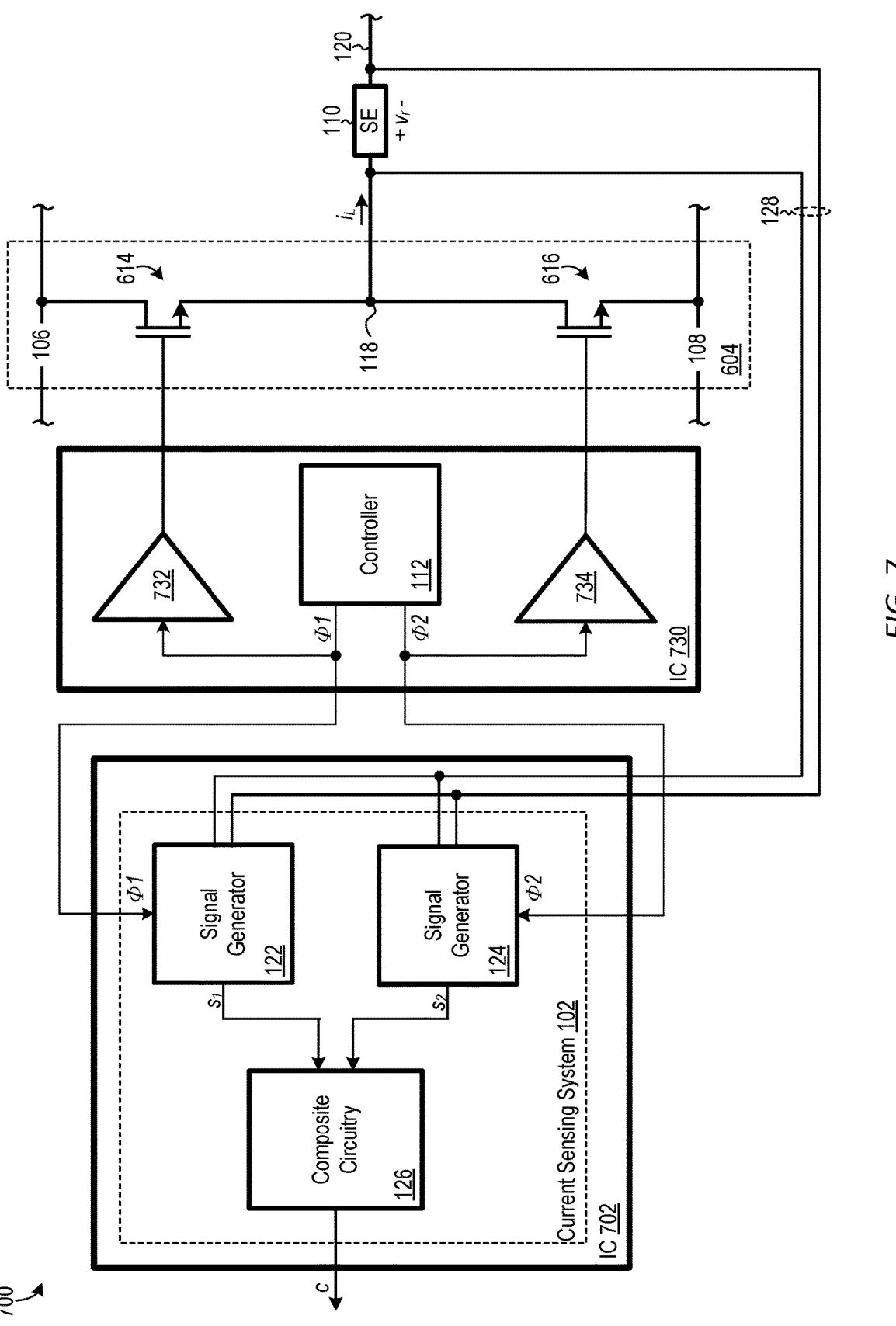
FIG. 7 is a schematic diagram of an embodiment of the FIG. 1 electrical apparatus where an integrated circuit including a controller and gate drivers provides control signals to an integrated circuit including a current sensing system.

Referring again to FIG. 1, other elements of electrical apparatus 100 could be partially or fully combined. For example, FIG. 7 is a schematic diagram of an electrical apparatus 700, which is an embodiment of electrical apparatus 100 where control and drive elements are co-packaged. Driver stage 104 of FIG. 1 is embodied by an instance of driver stage 604, discussed above with respect to FIG. 6, in electrical apparatus 700. Additionally, current sensing system 102 is packaged in an IC 702. Controller 112 is co-packaged with a first gate driver 732 and a second gate driver 734 in a common IC 730. First gate driver 732 is analogous to first gate driver 632 of FIG. 6, and second gate driver 734 is analogous to second gate driver 634 of FIG. 6. First control signal Φ1 and second control Φ2 are not only used for controlling first gate driver 732 and second gate driver 734 within IC 730, but these two control signals are also provided to IC 702 from IC 730. First signal generator 122 and second signal generator 124 are synchronized with first control signal Φ1 and second control Φ2, respectively, such as in a manner similar to that discussed above with respect to FIG. 4.

Figure 8:
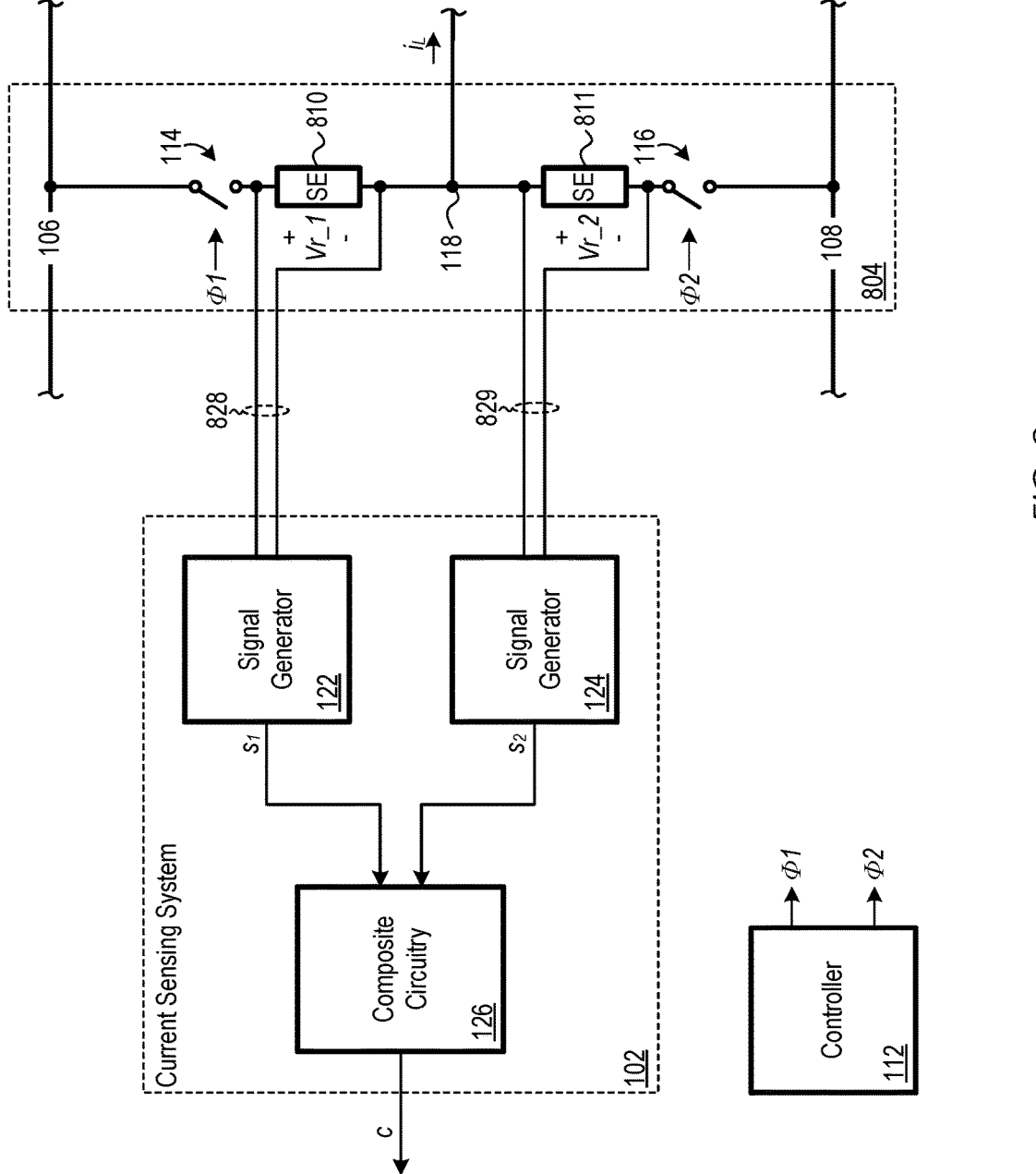
FIG. 8 is a schematic diagram of an alternate embodiment of the FIG. 1 electrical apparatus including two sensing elements.

Referring again to FIG. 1, electrical apparatus 100 could be modified to replace single sensing element 110 with dual sensing elements, where each of first signal generator 122 and second signal generator 124 is configured to sense current flowing through a respective one of the two sensing elements. For example, FIG. 8 is a schematic diagram of an electrical apparatus 800, which is an alternate embodiment of electrical apparatus 100 including a driver stage 802 in place of driver stage 104. Driver stage 804 includes an instance of first switching device 114, an instance of second switching device 116, a first sensing element 810, and a second sensing element 811. First switching device 114 and first sensing element 810 are electrically coupled in series between first power rail 106 and switching node 118, and second switching device 116 and second sensing element 811 are electrically coupled in series between switching node 118 and second power rail 108. The locations of first switching device 114 and first sensing element 810 could be swapped. Similarly, the locations of second switching device 116 and second sensing element 811 could be swapped. First sensing element 810 and second sensing element 811 take the place of single sensing element 110 of electrical apparatus 100, and sensing element 110 is accordingly omitted from electrical apparatus 800. In some embodiments of electrical apparatus 800, a load (not shown) or power source (not shown) is electrical coupled to switching node 118.

First signal generator 122 is configured to sense a voltage $v_{r\_1}$ across first sensing element 810 via first sensing lines 828, and second signal generator 124 is configured to sense a voltage $v_{r\_2}$ across second sensing element 811 via second sensing lines 829. Each of first sensing lines 828 and second sensing line 829 includes, for example, PCB traces, wires, or other electrical conductors. Each of first signal generator 122 and second signal generator 124 operates in electrical apparatus 800 in the same manner as discussed above with respect to electrical apparatus 100 of FIG. 1, except that each of the two signal generators generates is respective current signal in response to a voltage across a respective sensing element, instead of in response to a voltage across a common sensing element. In particular, in electrical apparatus 800, first signal generator 122 is configured to generate first current signal $s_1$ representing magnitude of current flowing through first sensing element 810 while first switching device 114 is in its on-state and second switching device 116 is in its off-state. For example, particular embodiments of first signal generator 122 are configured to generate first current signal $s_1$ at least partially by amplifying voltage $v_{r\_1}$ across first sensing element 810, such as in a manner similar to how first signal generator 422 (FIG. 4) amplifies voltage $v_r$ across sensing element 110, to generate first current signal $s_1$. Additionally, in electrical apparatus 800, second signal generator 124 is configured to generate second current signal $s_2$ representing magnitude of current flowing through second sensing element 811 while second switching device 116 is in its on-state and first switching device 114 is in its off-state. For example, particular embodiments of second signal generator 124 are configured to generate second current signal $s_2$ at least partially by amplify voltage $v_{r\_2}$ across second sensing element 811, such as in a manner similar to how second signal generator 424 (FIG. 4) amplifies voltage $v_r$ across sensing element 110, to generate second current signal $s_2$. Composite circuitry 126 operates in electrical apparatus 800 in the same manner as discussed above with respect to electrical apparatus 100 of FIG. 1.

Each of first sensing element 810 and second sensing element 811 includes, for example, a resistive device, such as a current sense resistor or other type of resistor. For example, in certain embodiments, first sensing element 810 is a first resistive device and second sensing element 811 is a second resistive device. Each of first sensing element 810 and second sensing element 811 need not be a discrete device. For example, each of first sensing element 810 and second sensing element 811 could be formed of one or more PCB conductors (e.g., PCB traces). Additionally, each of first sensing element 810 and second sensing element 811 could include multiple sub-elements, such as multiple resistive devices electrically coupled in series and/or in parallel.

Figure 9:
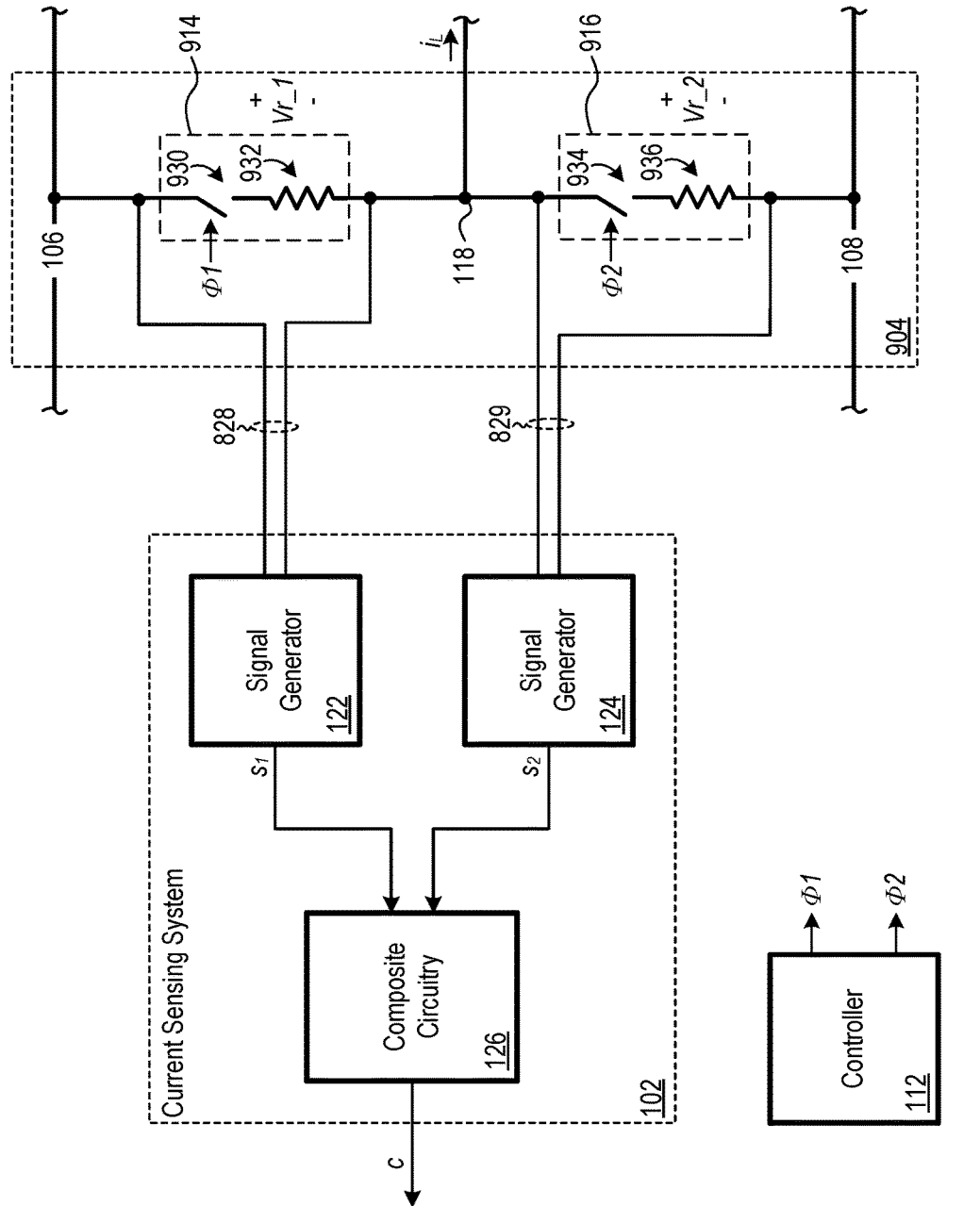
FIG. 9 is a schematic diagram of an alternate embodiment of the FIG. 8 electrical apparatus where resistance of switching device serves as sensing elements.

Furthermore, first sensing element 810 and second sensing element 811 could be embodied by resistance of first switching device 114 and resistance of second switching device 116, respectively. For example, FIG. 9 is a block diagram of an electrical apparatus 900, which is an alternate embodiment of electrical apparatus 800 of FIG. 8 where driver stage 804 is replaced with a driver stage 904. Driver stage 904 includes a first switching device 914 and a second switching device 916. First switching device 914 is electrically coupled between first power rail 106 and switching node 118, and second switching device 916 is electrically coupled between switching node 118 and second power rail 108. First switching device 914 is modeled in FIG. 9 as including an ideal switch 930 and parasitic resistance 932 electrically coupled in series, and second switching device 916 is modeled in FIG. 9 as including an ideal switch 934 and parasitic resistance 936 electrically coupled in series. Driver stage 904 does not include discrete sensing elements. However, parasitic resistance 932 of switching device 914 serves as a first sensing element analogous to first sensing element 810 of FIG. 8, and parasitic resistance 936 of second switching device 916 serves as a second sensing element analogous to second sensing element 811 of FIG. 8. Assuming that each of ideal switch 930 and ideal switch 934 has negligible resistance, voltage $v_{r\_1}$ across parasitic resistance 932 is essentially equal to voltage across first switching device 914 when ideal switch 930 is closed, and voltage $v_{r\_2}$ across parasitic resistance 936 is essentially equal to voltage across second switching device 916 when ideal switch 934 is closed. In embodiments where first switching device 914 and second switching device 916 are embodied by respective transistors, each of parasitic resistance 932 and parasitic resistance 936 includes, for example, transistor on-resistance. For example, in embodiments where each of first switching device 914 and second switching device 916 is embodied by a respective N-channel enhancement mode FET, each of parasitic resistance 932 and parasitic resistance 936 may be drain-to-source on-resistance (Rds_on) of its respective FET.

Figure 10:
FIG. 10 is a schematic diagram of an embodiment of the FIG. 1 electrical apparatus configured such that a driver stage of the electrical apparatus drive a load.
Figure 11:
FIG. 11 is a schematic diagram of an embodiment of the FIG. 10 electrical apparatus where the load is either an electric motor or a solenoid.

In certain embodiments of the aforementioned electrical apparatuses, the driver stages are configured to drive one or more loads. For example, FIG. 10 is a schematic diagram of an electrical apparatus 1000, which is an embodiment of electrical apparatus 100 of FIG. 1 where a load 1030 is electrically coupled between additional node 120 and second power rail 108, such that driver stage 104 is configured to drive load 1030. Details of current sensing system 102 are not shown in FIG. 10 for illustrative clarity. In some alternate embodiments, driver stage 104 is replaced with either driver stage 804 or driver stage 904, and load 1030 is electrically coupled to switching node 118. By way of example and not limitation, load 1030 may include an electric motor, a solenoid, a speaker, a coil for generating a magnetic field (e.g., for induction heating, wireless power transfer, or medical imaging), a flywheel, a lighting device, and/or a power converter. For example, FIG. 11 is a schematic diagram of an electrical apparatus 1100, which is an embodiment of electrical apparatus 1000 where load 1030 is embodied by an element 1130, which may be either an electric motor or a solenoid, as symbolically shown by element 1130 including a lumped resistive component and a lumped inductive component.

Figure 12:
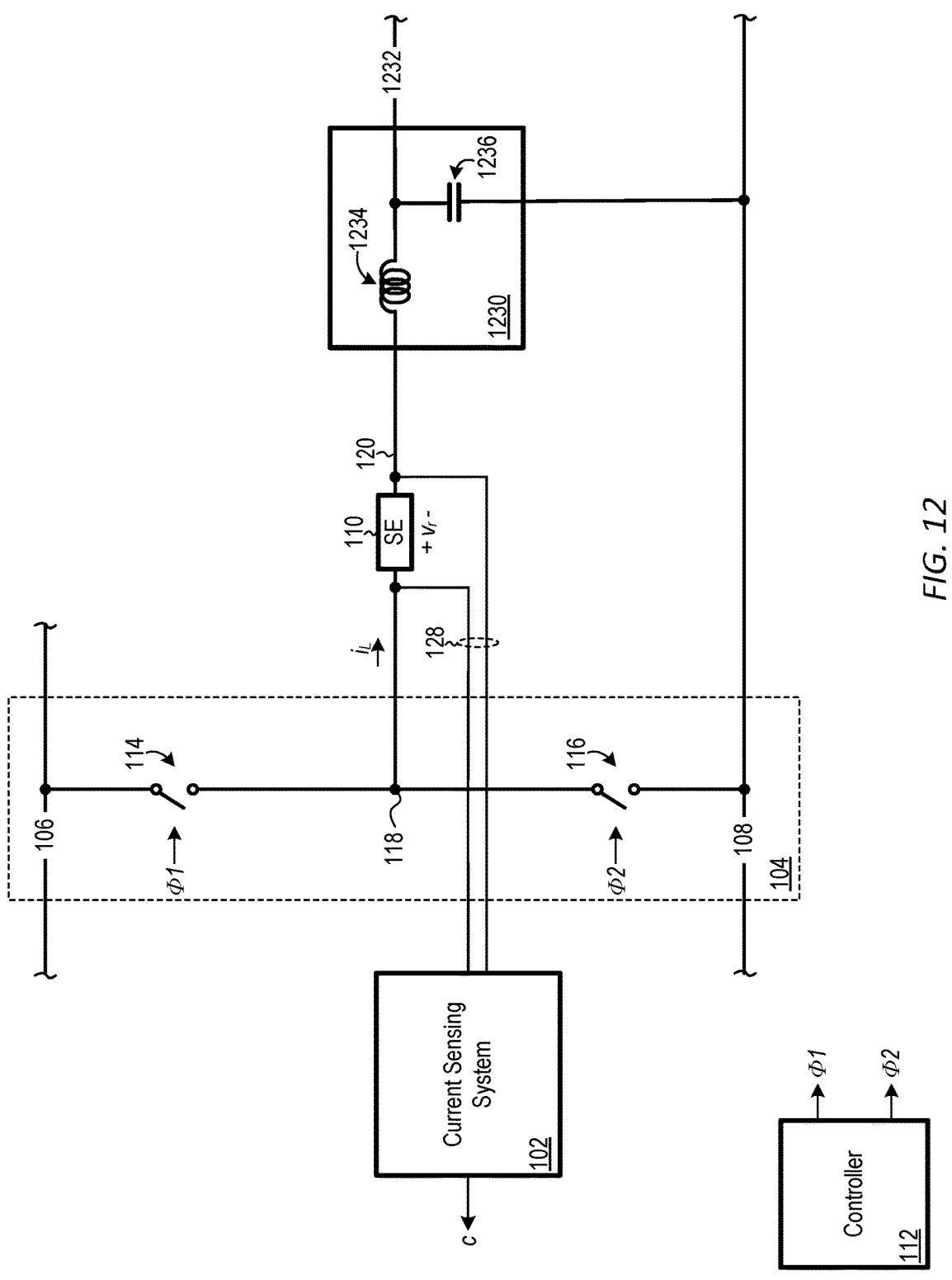
FIG. 12 is a schematic diagram of an embodiment of the FIG. 1 electrical apparatus that is configured to operate as a power converter.

Additionally, the aforementioned electrical apparatuses could be configured to at least partially form a power converter. For example, FIG. 12 is a schematic diagram of an electrical apparatus 1200, which is an embodiment of electrical apparatus 100 of FIG. 1 further including a filter 1230 electrically coupled between additional node 120 and a third power rail 1232, such that electrical apparatus 1200 may operate as a power converter. Filter 1230 includes (a) an inductor 1234 electrically coupled between additional node 120 and third power rail 1232 and (b) a capacitor 1236 electrically coupled between third power rail 1232 and second power rail 108. Details of current sensing system 102 are not shown in FIG. 12 for illustrative clarity. In certain embodiments of electrical apparatus 1200, controller 112 is configured to control driver stage 104 via first control signal Φ1 and second control signal Φ2 such that (a) electrical apparatus 1200 operates as a buck converter and power flows from first power rail 106 to third power rail 1232 or (b) electrical apparatus operates as a boost converter and power flows from third power rail 1232 to first power rail 106.

Figure 13:
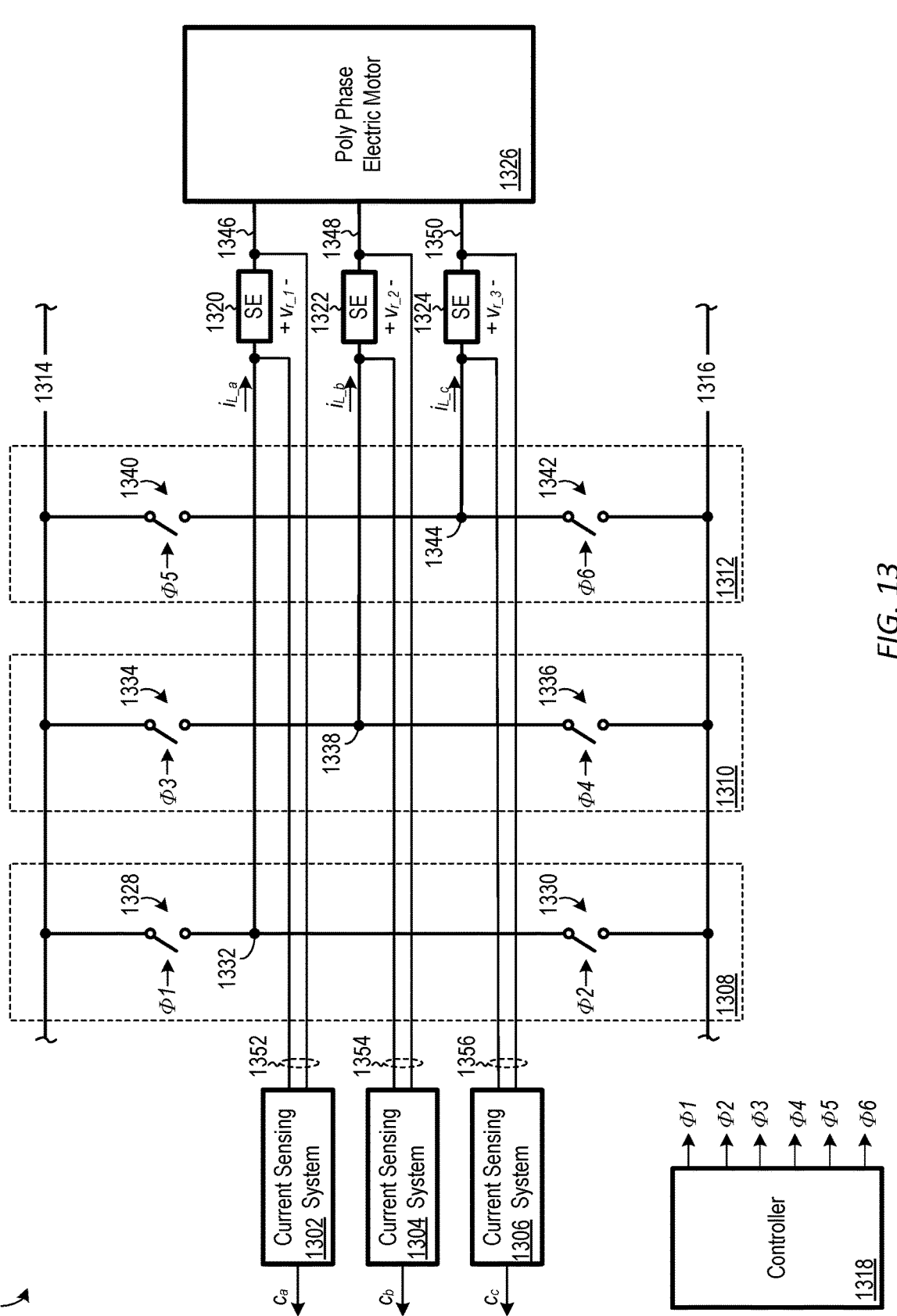
FIG. 13 is a schematic diagram of an electrical apparatus including a plurality of current sensing systems, according to an embodiment.

Multiple instances of the current sensing systems discussed above could be included in an electrical apparatus, such as to sense current flowing through multiple phases. For example, FIG. 13 is a schematic diagram of an electrical apparatus 1300 including a first current sensing system 1302, a second current sensing system 1304, a third current sensing system 1306, a first driver stage 1308, a second driver stage 1310, a third driver stage 1312, a first power rail 1314, a second power rail 1316, a controller 1318, a first sensing element 1320, a second sensing element 1322, a third sensing element 1324, and a poly phase electric motor 1326. First driver stage 1308 includes a first switching device 1328 and a second switching device 1330 controlled by a first control signal Φ1 and a second control signal Φ2, respectively. First switching device 1328 is electrically coupled between first power rail 1314 and a first switching node 1332, and second switching device 1330 is electrically coupled between first switching node 1332 and second power rail 1316. Second driver stage 1310 includes a third switching device 1334 and a fourth switching device 1336 controlled by a third control signal Φ3 and a fourth control signal Φ4, respectively. Third switching device 1334 is electrically coupled between first power rail 1314 and a second switching node 1338, and fourth switching device 1336 is electrically coupled between second switching node 1338 and second power rail 1316. Third driver stage 1312 includes a fifth switching device 1340 and a sixth switching device 1342 controlled by a fifth control signal Φ5 and a sixth control signal Φ6, respectively. Fifth switching device 1340 is electrically coupled between first power rail 1314 and a third switching node 1344, and sixth switching device 1342 is electrically coupled between third switching node 1344 and second power rail 1316. In certain embodiments, each of first switching device 1328, second switching device 1330, third switching device 1334, fourth switching device 1336, fifth switching device 1340, and sixth switching device 1342 includes one or more transistors, such as one more FETs, BJTs, IGBTs and/or WideBandgap devices such as GaN or SiC.

First sensing element 1320 is electrically coupled between first switching node 1332 and a first additional node 1346, and each of first switching device 1328 and second switching device 1330 is therefore electrically coupled to first sensing element 1320 at first switching node 1332. Additionally, second sensing element 1322 is electrically coupled between second switching node 1338 and a second additional node 1348, and each of third switching device 1334 and fourth switching device 1336 is therefore electrically coupled to second sensing element 1322 at second switching node 1338. Furthermore, third sensing element 1324 is electrically coupled between third switching node 1344 and a third additional node 1350, and each of fifth switching device 1340 and sixth switching device 1342 is therefore electrically coupled to third sensing element 1324 at third switching node 1344. In certain embodiments, each of first sensing element 1320, second sensing element 1322, and third sensing element 1324 includes a resistive device, such as a current sense resistor or other type of resistor. Each of first sensing element 1320, second sensing element 1322, and third sensing element 1324 need not be a discrete device. For example, each of first sensing element 1320, second sensing element 1322, and third sensing element 1324 could be formed of one or more PCB conductors (e.g., PCB traces), or each of first sensing element 1320, second sensing element 1322, and third sensing element 1324 could be embodied by parasitic resistance of an element, such as parasitic resistance of an inductor or a transformer winding. Additionally, each of first sensing element 1320, second sensing element 1322, and third sensing element 1324 could include a plurality of sub-elements, such as two or more resistive devices electrically coupled in series and/or in parallel Poly phase electric motor 1326 is electrically coupled to each of first additional node 1346, second additional node 1348, and third additional node 1350. Accordingly, poly phase electric motor 1326 is driven by first driver stage 1308, second driver stage 1310, and third driver stage 1312. Although poly phase electric motor 1326 is a three phase electric motor in electrical apparatus 1300, poly stage electric motor 1326 could be replaced with a motor having a different number of phases, with appropriate adjustment to the number of driver stages in electrical apparatus 1300. For example, poly phase electric motor 1326 could be replaced with a two phase electric motor, and third driver stage 1312 could be accordingly be omitted. As another example, poly phase electric motor 1326 could be replaced with a four phase electric motor, with the addition of another driver stage to electrical apparatus 1300.

Controller 1318 is configured to generate first control signal Φ1, second control signal Φ2, third control signal Φ3, fourth control signal Φ4, fifth control signal Φ5, and sixth control signal Φ6 to control first switching device 1328, second switching device 1330, third switching device 1334, fourth switching device 1336, fifth switching device 1340, and sixth switching device 1342, respectively. Connections between controller 1318 and first switching device 1328, second switching device 1330, third switching device 1334, fourth switching device 1336, fifth switching device 1340, and sixth switching device 1342 are not shown. Controller 1318 is configured to generate first control signal Φ1 and second control signal Φ2 to cause first driver stage 1308 to repeatedly switch between first and second states, such as to help achieve desired control of poly phase electric motor 1326. The first state of driver stage 1308 is characterized by first switching device 1328 being in its on-state and second switching device 1330 being in its off-state, such that driver stage 1308 electrically couples first sensing element 1320 to first power rail 1314. Conversely, the second state of driver stage 1308 is characterized by first switching device 1328 being in its off-state and second switching device 1330 being in its on-state, such that driver stage 1308 electrically couples first sensing element 1320 to second power rail 1316.

Additionally, controller 1318 is configured to generate third control signal Φ3 and fourth control signal Φ4 to cause second driver stage 1310 to repeatedly switch between first and second states, such as to help achieve desired control of poly phase electric motor 1326. The first state of driver stage 1310 is characterized by third switching device 1334 being in its on-state and fourth switching device 1336 being in its off-state, such that driver stage 1310 electrically couples second sensing element 1322 to first power rail 1314. Conversely, the second state of driver stage 1310 is characterized by third switching device 1334 being in its off-state and fourth switching device 1336 being in its on-state, such that driver stage 1310 electrically couples second sensing element 1322 to second power rail 1316.

Furthermore, controller 1318 is configured to generate fifth control signal Φ5 and sixth control signal Φ6 to cause third driver stage 1312 to repeatedly switch between first and second states, such as to help achieve desired control of poly phase electric motor 1326. The first state of driver stage 1312 is characterized by fifth switching device 1340 being in its on-state and sixth switching device 1342 being in its off-state, such that driver stage 1312 electrically couples third sensing element 1324 to first power rail 1314. Conversely, the second state of driver stage 1312 is characterized by fifth switching device 1340 being in its off-state and sixth switching device 1342 being in its on-state, such that driver stage 1312 electrically couples third sensing element 1324 to second power rail 1316.

Controller 1318 may be further configured generate control signals Φ1, Φ2, Φ3, Φ4, Φ5, and Φ6 to cause each driver stage 1308, 1310, and 1312 to operate in one or more additional states, such as a third state during transitions between the first state and the second state, in a manner similar to that discussed above with respect to electrical apparatus 100 of FIG. 1. Additionally, certain embodiments of controller 1318 are configured to generate control signals Φ1, Φ2, Φ3, Φ4, Φ5, and Φ6 to cause each driver stage 1308, 1310, and 1312 to repeatedly switch between its first state and its second state using a PWM control technique or a PFM control technique, such as to achieve desired control of poly phase electric motor 1326.

First current sensing system 1302 is configured to sense a voltage $v_{r\_1}$ across first sensing element 1320 via first sensing lines 1352, and second current sensing system 1304 is configured to sense a voltage $v_{r\_2}$ across second sensing element 1322 via second sensing lines 1354. Additionally, third current sensing system 1306 is configured to sense a voltage $v_{r\_3}$ across third sensing element 1324 via third sensing lines 1356. Each of first sensing lines 1352, second sensing lines 1354, and third sensing lines 1356 includes, for example, PCB traces, wires, or other electrical conductors.

Each of first current sensing system 1302, second current sensing system 1304, and third current sensing system 1306 is an embodiment of current sensing system 102 of FIG. 1. As such, each of first current sensing system 1302, second current sensing system 1304, and third current sensing system 1306 includes a respective instance of first signal generator 122, second signal generator 124, and composite circuitry 126, which are not shown in FIG. 13 for illustrative clarity. Accordingly, first current sensing system 1302 is configured to generate a composite current signal $c_a$ representing magnitude of current $i_{L\_a}$ flowing through first sensing element 1320, second current sensing system 1304 is configured to generate a composite current signal $c_b$ representing magnitude of current $i_{L\_b}$ flowing through second sensing element 1322, and third current sensing system 1306 is configured to generate a composite current signal $c_c$ representing magnitude of current $i_{L\_c}$ flowing through third sensing element 1324.

Combinations of Features

Features described above may be combined in various ways without departing from the scope hereof. The following examples illustrate some possible combinations.

(A1) A method for sensing current includes (1) generating a first current signal representing magnitude of current flowing through a sensing element while a first switching device is in its on-state and a second switching device is in its off-state, each of the first switching device and the second switching device being electrically coupled to the sensing element, (2) generating a second current signal representing magnitude of current flowing through the sensing element while the first switching device is in its off-state and the second switching device is in its on-state, and (3) generating a composite current signal from the first current signal and the second current signal, the composite current signal representing magnitude of current flowing through the sensing element.

(A2) In the method denoted as (A1), generating the composite current signal from the first current signal and the second current signal may include superimposing the first current signal and the second current signal.

(A3) In either one of the methods denoted as (A1) and (A2), generating the composite current signal from the first current signal and the second current signal may include generating the composite current signal such that the composite current signal represents either the first current signal or the second current signal at any given time.

(A4) In any one of the methods denoted as (A1) through (A3), generating the composite current signal from the first current signal and the second current signal may include (1) generating the composite current signal from the first current signal, and not the second current signal, while the first switching device is in its on-state and the second switching device is in its off-state, and (2) generating the composite current signal from the second current signal, and not the first current signal, while the first switching device is in its off-state and the second switching device is in its on-state.

(A5) In any one of the methods denoted as (A1) through (A4), (1) generating the first current signal may include amplifying a voltage across the sensing element while the first switching device is in its on-state and the second switching device is in its off-state, and (2) generating the second current signal may include amplifying a voltage across the sensing element while the first switching device is in its off-state and the second switching device is in its on-state (A6) In any one of the methods denoted as (A1) through (A5), the first switching device and the second switching device may collectively form a driver stage.

(A7) In the method denoted as (A6), each of the first switching device and the second switching device may be electrically coupled to the sensing element at a switching node of the driver stage.

(A8) In any one of the methods denoted as (A1) through (A7), the sensing element may include a resistive device.

(B1) A method for sensing current in an electrical apparatus including a driver stage and a sensing element includes (1) generating a first current signal representing magnitude of current flowing through the sensing element while the driver stage operates in a first state, the first state being characterized at least partially by the driver stage electrically coupling the sensing element to a first power rail, (2) generating a second current signal representing magnitude of current flowing through the sensing element while the driver stage operates in a second state, the second state being characterized at least partially by the driver stage electrically coupling the sensing element to a second power rail, and (3) generating a composite current signal from the first current signal and the second current signal, the composite current signal representing magnitude of current flowing through the sensing element.

(B2) In the method denoted as (B1), the driver stage may repeatedly switch between the first state and the second state.

(B3) In either one of the methods denoted as (B1) and (B2), generating the composite current signal from the first current signal and the second current signal may include superimposing the first current signal and the second current signal.

(B4) In any one of the methods denoted as (B1) through (B3), generating the composite current signal from the first current signal and the second current signal may include generating the composite current signal such that the composite current signal represents either the first current signal or the second current signal at any given time.

(B5) In any one of the methods denoted as (B1) through (B4), generating the composite current signal from the first current signal and the second current signal may include (1) generating the composite current signal from the first current signal, and not the second current signal, while the driver stage operates in the first state, and (2) generating the composite current signal from the second current signal, and not the first current signal, while the driver stage operates in the second state.

(B6) In any one of the methods denoted as (B1) through (B5), generating the composite current signal from the first current signal and the second current signal may include at least one of (1) generating the composite current signal such that the composite current signal represents a last-sampled magnitude of current flowing through the sensing element while the driver stage operates in the first state, during a transition of the driver stage from the first state to the second state, and (2) generating the composite current signal such that the composite current signal represents a last-sampled magnitude of current flowing through the sensing element while the driver stage operates in the second state, during a transition of the driver stage from the second state to the first state.

(B7) In any one of the methods denoted as (B1) through (B6), the sensing element may include a resistive device.

(C1) A method for sensing current includes (1) generating a first current signal representing magnitude of current flowing through a first sensing element while a first switching device is in its on-state and a second switching device is in its off-state, (2) generating a second current signal representing magnitude of current flowing through a second sensing element while the first switching device is in its off-state and the second switching device is in its on-state, and (3) generating a composite current signal from the first current signal and the second current signal, the composite current signal representing magnitude of current flowing through each of the first sensing element and the second sensing element.

(C2) In the method denoted as (C1), generating the composite current signal from the first current signal and the second current signal may include superimposing the first current signal and the second current signal.

(C3) In either one of the methods denoted as (C1) and (C2), generating the composite current signal from the first current signal and the second current signal may include generating the composite current signal such that the composite current signal represents one of the first current signal and the second current signal at any given time.

(C4) In any one of the methods dented as (C1) through (C3), (1) generating the first current signal may include amplifying a voltage across the first sensing element while the first switching device is in its on-state and the second switching device is in its off-state, and (2) generating the second current signal may include amplifying a voltage across the second sensing element while the first switching device is in its off-state and the second switching device is in its on-state.

(C5) In any one of the methods denoted as (C1) through (C4), the first switching device and the second switching device may collectively form a driver stage.

(C6) In any one of the methods denoted as (C1) through (C5), the first switching device and the first sensing element may be electrically coupled in series, and the second switching device and the second sensing element may be electrically coupled in series.

(C7) In any one of the methods denoted as (C1) through (C5), the first sensing element may include resistance of the first switching device, and the second sensing element may include resistance of the second switching device.

(D1) A system for sensing current in an electrical apparatus including a driver stage and a sensing element includes (1) a first signal generator configured to generate a first current signal representing magnitude of current flowing through the sensing element while the driver stage operates in a first state, (2) a second signal generator configured to generate a second current signal representing magnitude of current flowing through the sensing element while the driver stage operates in a second state, and (3) composite circuitry configured to generate a composite current signal from the first current signal and the second current signal, the composite current signal representing current flowing through the sensing element.

(D2) In the system denoted as (D1), the first signal generator may include a first amplifier and first switching circuitry, where the first switching circuitry is configured to selectively electrically couple inputs of the first amplifier across the sensing element, and where the first amplifier is configured to generate the first current signal, and (2) the second signal generator may include a second amplifier and second switching circuitry, where the second switching circuitry is configured to selectively electrically couple inputs of the second amplifier across the sensing element, and where the second amplifier is configured to generate the second current signal.

(D3) In the system denoted as (D2), each of the first switching circuitry and the second switching circuitry may be configured to be synchronized with control signals of the electrical apparatus.

(D4) In any one of the systems denoted as (D1) through (D3), the composite circuitry may be configured to generate the composite current signal at least partially by superimposing the first current signal and the second current signal.

(D5) In any one of the systems denoted as (D1) through (D4), the composite circuitry may be configured to generate the composite current signal from the first current signal and the second current signal such that the composite current signal represents one of the first current signal and the second current signal at any given time.

(E1) An electrical apparatus includes (1) a driver stage including (a) a first switching device electrically coupled to a switching node and (b) a second switching device electrically coupled to the switching node, (2) a sensing element electrically coupled to the switching node, and (3) a current sensing system. The current sensing system includes (1) a first signal generator configured to generate a first current signal representing magnitude of current flowing through the sensing element while the first switching device is in its on-state and the second switching device is in its off-state, (2) a second signal generator configured to generate a second current signal representing magnitude of current flowing through the sensing element while the first switching device is in its off-state and the second switching device is in its on-state, and (3) composite circuitry configured to generate a composite current signal from the first current signal and the second current signal, the composite current signal representing current flowing through the sensing element.

(E2) The electrical apparatus denoted as (E1) may further include a controller configured to cause the driver stage to repeatedly switch between a first state and a second state, where (1) the first state is characterized by the first switching device being in its on-state and the second switching device being in its off-state and (2)

the second state is characterized by the first switching device being in its off-state and the second switching device being in its on-state.

(E3) In either one of the electrical apparatuses denoted as (E1) and (E2), the sensing element may be electrically coupled to the switching node such that the sensing element is electrically coupled between the switching node and an additional node, and the electrical apparatus may further include a load electrically coupled to the additional node.

(E4) In the electrical apparatus denoted as (E3), the load may be selected from the group consisting of an electric motor and a solenoid.

(E5) In any one of the electrical apparatuses denoted as (E1) through (E4), the composite circuitry may be configured to generate the composite current signal at least partially by superimposing the first current signal and the second current signal.

(E6) In any one of the electrical apparatuses denoted as (E1) through (E5), the composite circuitry may be configured to generate the composite current signal from the first current signal and the second current signal such that the composite current signal represents either the first current signal or the second current signal at any given time.

(E7) In any one of the electrical apparatuses denoted as (E1) through (E6), (1) the first switching device may be electrically coupled to the switching node such that the first switching device is electrically coupled between a first power rail and the switching node, and (2) the second switching device may be electrically coupled to the switching node such that the second switching device is electrically coupled between the switching node and a second power rail.

(F1) An electrical apparatus includes (1) a driver stage including (a) a first switching device and a first sensing element coupled in series and (b) a second switching device and a second sensing element electrically coupled in series, and (2) a current sensing system. The current sensing system includes (1) a first signal generator configured to generate a first current signal representing magnitude of current flowing through the first sensing element while the first switching device is in its on-state and the second switching device is in its off-state, (2) a second signal generator configured to generate a second current signal representing magnitude of current flowing through the second sensing element while the first switching device is in its off-state and the second switching device is in its on-state, and (3) composite circuitry configured to generate a composite current signal from the first current signal and the second current signal, the composite current signal representing current flowing through the first sensing element and the second sensing element.

(F2) The electrical apparatus denoted as (F1) may further include a controller configured to cause the driver stage to repeatedly switch between a first state and a second state, where (1) the first state is characterized by the first switching device being in its on-state and the second switching device being in its off-state, and (2) the second state is characterized by the first switching device being in its off-state and the second switching device being in its on-state.

(F3) In either one of the apparatuses denoted as (F1) and (F2), (1) the first switching device and the first sensing element may be electrically coupled in series between a first power rail and a switching node, (2) the second switching device and the second sensing element may be electrically coupled in series between the switching node and a second power rail, and (3) the electrical apparatus may further include a load electrically coupled to the switching node.

(F4) In the method denoted as (F3), the load may be selected from the group consisting of an electric motor and a solenoid.

(F5) In any one of the apparatuses denoted as (F1) through (F4), the composite circuitry may be configured to generate the composite current signal at least partially by superimposing the first current signal and the second current signal.

(F6) In any one of the apparatuses denoted as (F1) through (F5), the composite circuitry may be configured to generate the composite current signal from the first current signal and the second current signal such that the composite current signal represents either the first current signal or the second current signal at any given time.

(F7) In any one of the apparatuses denoted as (F1) through (F6), (1) the first sensing element may include a first resistive device, and (2) the second sensing element may include a second resistive device.

(F8) In any one of the apparatuses denoted as (F1) through (F6), (1) the first sensing element may include resistance of the first switching device, and (2) the second sensing element comprises resistance of the second switching device.

Changes may be made in the above methods, devices, and systems without departing from the scope hereof. It should thus be noted that the matter contained in the above description and shown in the accompanying drawings should be interpreted as illustrative and not in a limiting sense. The following claims are intended to cover generic and specific features described herein, as well as all statements of the scope of the present method and system, which as a matter of language, might be said to fall therebetween.

What is claimed is:

1. A method for sensing current, the method comprising:
generating a first current signal representing magnitude of current flowing through a sensing element while a first switching device is in its on-state and a second switching device is in its off-state, each of the first switching device and the second switching device being electrically coupled to the sensing element, wherein generating the first current signal comprises amplifying a voltage across the sensing element while the first switching device is in its on-state and the second switching device is in its off-state;
generating a second current signal representing magnitude of current flowing through the sensing element while the first switching device is in its off-state and the second switching device is in its on-state, wherein generating the second current signal comprises amplifying a voltage across the sensing element while the first switching device is in its off-state and the second switching device is in its on-state; and
generating a composite current signal from the first current signal and the second current signal, the composite current signal representing magnitude of current flowing through the sensing element.

2. The method of claim 1, wherein generating the composite current signal from the first current signal and the second current signal comprises superimposing the first current signal and the second current signal.

3. The method of claim 1, wherein generating the composite current signal from the first current signal and the second current signal comprises generating the composite current signal such that the composite current signal represents either the first current signal or the second current signal at any given time.

4. The method of claim 1, wherein generating the composite current signal from the first current signal and the second current signal comprises:
generating the composite current signal from the first current signal, and not the second current signal, while the first switching device is in its on-state and the second switching device is in its off-state; and
generating the composite current signal from the second current signal, and not the first current signal, while the first switching device is in its off-state and the second switching device is in its on-state.

5. The method of claim 1, wherein the first switching device and the second switching device collectively form a driver stage.

6. The method of claim 5, wherein each of the first switching device and the second switching device is electrically coupled to the sensing element at a switching node of the driver stage.

7. The method of claim 1, wherein the sensing element comprises a resistive device.

8. A method for sensing current in an electrical apparatus including a driver stage and a sensing element, the method comprising:
generating a first current signal representing magnitude of current flowing through the sensing element while the driver stage operates in a first state, the first state being characterized at least partially by the driver stage electrically coupling the sensing element to a first power rail;
generating a second current signal representing magnitude of current flowing through the sensing element while the driver stage operates in a second state, the second state being characterized at least partially by the driver stage electrically coupling the sensing element to a second power rail; and
generating a composite current signal from the first current signal and the second current signal, the composite current signal representing magnitude of current flowing through the sensing element, wherein generating the composite current signal from the first current signal and the second current signal comprises at least one of (a) generating the composite current signal such that the composite current signal represents a last-sampled magnitude of current flowing through the sensing element while the driver stage operates in the first state, during a transition of the driver stage from the first state to the second state, and (b) generating the composite current signal such that the composite current signal represents a last-sampled magnitude of current flowing through the sensing element while the driver stage operates in the second state, during a transition of the driver stage from the second state to the first state.

9. The method of claim 8, wherein the driver stage repeatedly switches between the first state and the second state.

10. The method of claim 8, wherein generating the composite current signal from the first current signal and the second current signal comprises superimposing the first current signal and the second current signal.

11. The method of claim 8, wherein generating the composite current signal from the first current signal and the second current signal comprises generating the composite current signal such that the composite current signal represents either the first current signal or the second current signal at any given time.

12. The method of claim 8, wherein generating the composite current signal from the first current signal and the second current signal comprises:

generating the composite current signal from the first current signal, and not the second current signal, while the driver stage operates in the first state; and generating the composite current signal from the second current signal, and not the first current signal, while the driver stage operates in the second state.

13. The method of claim 8, wherein the sensing element comprises a resistive device.

14. A method for sensing current, the method comprising:

generating a first current signal representing magnitude of current flowing through a first sensing element while a first switching device is in its on-state and a second switching device is in its off-state, wherein generating the first current signal comprises amplifying a voltage across the first sensing element while the first switching device is in its on-state and the second switching device is in its off-state;

generating a second current signal representing magnitude of current flowing through a second sensing element while the first switching device is in its off-state and the second switching device is in its on-state, generating the second current signal comprises amplifying a voltage across the second sensing element while the first switching device is in its off-state and the second switching device is in its on-state; and generating a composite current signal from the first current signal and the second current signal, the composite current signal representing magnitude of current flowing through each of the first sensing element and the second sensing element.

15. The method of claim 14, wherein generating the composite current signal from the first current signal and the second current signal comprises superimposing the first current signal and the second current signal.

16. The method of claim 14, wherein generating the composite current signal from the first current signal and the second current signal comprises generating the composite current signal such that the composite current signal represents one of the first current signal and the second current signal at any given time.

17. The method of claim 14, wherein the first switching device and the second switching device collectively form a driver stage.

* * * * *